United States Patent
Minamio et al.

(10) Patent No.: US 7,876,570 B2
(45) Date of Patent: *Jan. 25, 2011

(54) MODULE WITH EMBEDDED ELECTRONIC COMPONENTS

(75) Inventors: Masanori Minamio, Osaka (JP); Hideki Takehara, Hyogo (JP); Yoshiyuki Arai, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/566,186

(22) Filed: Sep. 24, 2009

(65) Prior Publication Data

US 2010/0014262 A1 Jan. 21, 2010

Related U.S. Application Data

(62) Division of application No. 11/488,628, filed on Jul. 19, 2006, now Pat. No. 7,606,047.

(30) Foreign Application Priority Data

Oct. 18, 2005 (JP) .............................. 2005-302917
Mar. 20, 2006 (JP) .............................. 2006-076107

(51) Int. Cl.
*H05K 1/16* (2006.01)
(52) U.S. Cl. ...................... 361/766; 361/761; 361/767; 174/520; 174/521
(58) Field of Classification Search ................. 361/760, 361/761, 765, 736, 737, 739, 748–751, 767–771; 174/520, 521, 522, 30–31 R; 257/787–794; 438/106, 112
See application file for complete search history.

(56) References Cited

U.S. PATENT DOCUMENTS 4,744,863 A 5/1988 Guckel et al.

(Continued)

FOREIGN PATENT DOCUMENTS

JP 2002-190486 A 7/2002

(Continued)

*Primary Examiner*—Dameon E Levi
*Assistant Examiner*—Hoa C Nguyen
(74) *Attorney, Agent, or Firm*—McDermott Will & Emery LLP

(57) ABSTRACT

In a module with embedded electronic components, connection electrodes are formed on the component mounting surface of a substrate. The electrode portions of each of the electronic components are placed on the individual connection electrodes and connected in fixed relation thereto by using a solder. The electronic components are encapsulated in an encapsulating resin. When the distance between the lower surface of the main body portion of each of the electronic components and the component mounting surface is assumed to be a and the thickness of the portion of the encapsulating resin which is located above the main body portion of the electronic component is assumed to be b, if b/a is set to a value of not more than 6, it becomes possible to prevent, when the module with embedded electronic components is reflow-mounted on a printed wiring substrate or the like, the occurrence of a short circuit failure resulting from the melting and flowing of the solder which causes a short circuit between the two electrode portions.

4 Claims, 4 Drawing Sheets

U.S. PATENT DOCUMENTS

| | | |
|---|---|---|
| 6,307,749 B1 | 10/2001 | Daanen et al. |
| 7,084,352 B2 | 8/2006 | Kobayashi |
| 7,397,139 B2 | 7/2008 | Ikezawa et al. |
| 2004/0056337 A1* | 3/2004 | Hasebe et al. ............... 257/667 |
| 2004/0112633 A1 | 6/2004 | Endo et al. |
| 2004/0262782 A1 | 12/2004 | Ellis et al. |
| 2005/0054141 A1* | 3/2005 | Kim et al. ................... 438/111 |
| 2006/0151858 A1* | 7/2006 | Ahn et al. ................... 257/666 |
| 2006/0249824 A1* | 11/2006 | Lee et al. .................... 257/678 |
| 2006/0273461 A1* | 12/2006 | Otsuka ........................ 257/754 |
| 2007/0018312 A1* | 1/2007 | Jo ............................... 257/720 |

FOREIGN PATENT DOCUMENTS

| | | |
|---|---|---|
| JP | 2002-190564 A | 7/2002 |
| JP | 2002-190565 A | 7/2002 |
| JP | 2002-208668 A | 7/2002 |
| JP | 2005-109135 A | 4/2005 |

* cited by examiner

| b/a | 2.2~3.0 | 3.2~4.0 | 4.2~5.0 | 5.2~7.0 |
|---|---|---|---|---|
| c | 460 μm~500 μm | 510 μm~550 μm | 560 μm~600 μm | 610 μm~700 μm |
| First-Time Reflow Step | 0/30 | 0/30 | 0/30 | 2/10 |
| Second-Time Reflow Step | 0/30 | 0/30 | 5/30 | 1/8 |

| b/a | 2.0~3.0 | | | 5.2~6.5 | | |
|---|---|---|---|---|---|---|
| c | 450μm~500μm | | | 610μm~670μm | | |
| Reflow Temperature | 260°C | 270°C | 280°C | 260°C | 270°C | 280°C |
| First-Time Reflow Step | 0/100 | 0/100 | 0/100 | 1/30 | 5/30 | 9/30 |
| Second-Time Reflow Step | 0/100 | 0/100 | 0/100 | 2/29 | 7/25 | 4/21 |

US 7,876,570 B2

MODULE WITH EMBEDDED ELECTRONIC COMPONENTS

CROSS-REFERENCE TO RELATED APPLICATIONS

This application is a Divisional of U.S. patent application Ser. No. 11/488,628, filed on Jul. 19, 2006, now U.S. Pat. No. 7,606,047, claiming priority of Japanese Patent Applications JP 2005-302917, filed Oct. 18, 2005, and JP 2006-76107, filed Mar. 20, 2006, the entire contents of each of which are hereby incorporated by reference.

BACKGROUND OF THE INVENTION

The present invention relates to a module with embedded electronic components and, more particularly, to a module having a plurality of embedded electronic components which are mounted on a substrate and encapsulated in a resin.

Electronic devices such as a mobile telephone and a mobile music reproducer have been increasingly reduced in size and weight under the slogan of "miniaturization". Consequently, it is essential for components used for electronic devices to be also reduced in size and weight and the development thereof has been promoted toward further miniaturization. As part of the development, the development of a module product (semiconductor device) in which a semiconductor integrated circuit and components such as a resistor and a capacitor are collectively mounted on a single substrate to perform a specified function can be mentioned.

As such a module product, a module in which a semiconductor chip and chip components such as a chip capacitor and a chip resistor are mounted on a substrate to perform a battery protecting function or the like has been known. Examples of the module are disclosed in, e.g., Japanese Laid-Open Patent Publication Nos. 2002-190564, 2002-190565, 2002-190486, 2005-109135, and 2002-208668. It has been common practice to entirely encapsulate such a module in a resin for the purpose of protecting the semiconductor chip and chip components mounted thereon.

Such a module product is soldered by a reflow process onto a mounting substrate such as a printed wiring substrate. However, as described in Japanese Laid-Open Patent Publication No. 2002-208668, the problem has been encountered that the solder of a soldered component (chip component) remelts in the module during a reflow-mounting step, which leads to the occurrence of a short circuit. According to Japanese Laid-Open Patent Publication No. 2002-208668, the short-circuit phenomenon occurs as follows. When the solder remelts, it undergoes melt expansion and produces a pressure (remelt expansion pressure) which causes delamination at the interface between the component and a resin or at the interface between the resin and the module substrate. As a result, the solder flushingly flows in the delaminated portion and provides an undesirable linkage between the both-end terminals of the chip component, which results in the short-circuit phenomenon. To prevent the phenomenon, Japanese Laid-Open Patent Publication No. 2002-208668 discloses the use of a resin which has both the ability (mechanical strength) to protect internal components and flexibility capable of reducing the remelt expansion pressure of the solder.

However, the resin disclosed in Japanese Laid-Open Patent Publication No. 2002-208668 is a special resin. Before using the special resin in place of a conventional encapsulating resin, there are numerous requirements to be satisfied, including ease of molding, a satisfactory yield after encapsulation, and long-term in-use stability. In addition, there is also the problem of higher cost.

SUMMARY OF THE INVENTION

A module with embedded electronic components in a first aspect of the present invention comprises: a substrate; a plurality of electronic components each of which is mounted on the substrate and is at least one of a resistor, a capacitor, and a coil; and an encapsulating resin in which the electronic components are encapsulated, wherein connection electrodes connected to the electronic components are formed on a component mounting surface of the substrate on which the electrode components are mounted, each of the electronic components comprises two electrode portions fixed to the individual connection electrodes each by using a solder and a main body portion interposed between the two electrode portions, and when a distance between the component mounting surface and a lower surface of the main body portion is assumed to be a and a thickness of the portion of the encapsulating resin which is located above the main body portion is assumed to be b, b/a is not more than 6.

A module with embedded electronic components in a second aspect of the present invention comprises: a substrate; a plurality of electronic components each of which is mounted on the substrate and is at least one of a resistor, a capacitor, and a coil; and an encapsulating resin in which the electronic components are encapsulated, wherein connection electrodes connected to the electronic components are formed on a component mounting surface of the substrate on which the electrode components are mounted, each of the electronic components comprises two electrode portions fixed to the individual connection electrodes each by using a solder and a main body portion interposed between the two electrode portions, a thickness of the portion of the encapsulating resin which is located above the component mounting surface is not less than 400 μm and not more than 600 μm, and a distance between the component mounting surface and a lower surface of the main body portion is not less than 30 μm and not more than 60 μm Such an arrangement can prevent the solder from flowing and providing a linkage between the two electrode portions in the step of reflow-mounting the module with embedded electronic components onto a printed wiring substrate or the like.

DESCRIPTION OF THE PREFERRED EMBODIMENTS

Figure 1:
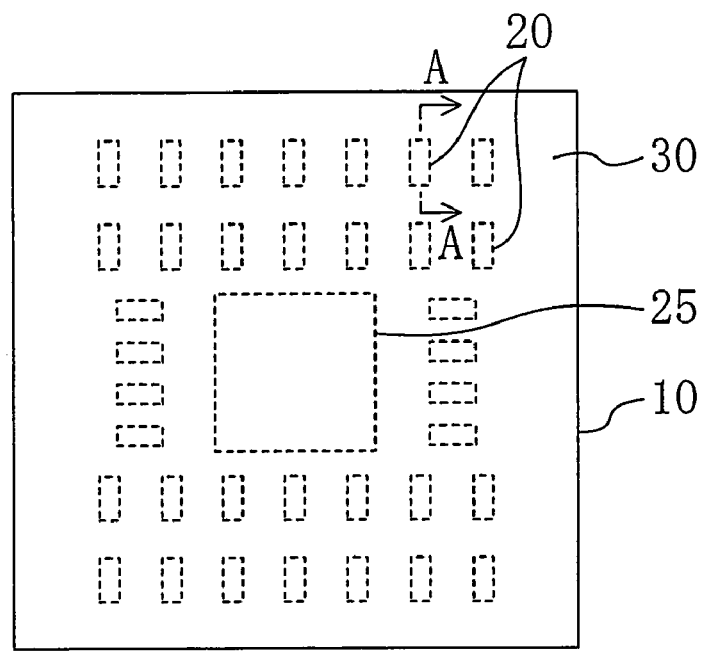
FIG. 1 is a plan view of a module with embedded electronic components.

Although Japanese Laid-Open Patent Publication No. 2002-208668 has attributed the cause of the short-circuit failure occurring in the step of reflow-mounting the module to the printed wiring substrate to the melt expansion pressure when the solder remelts, the present inventors considered that a pressure resulting from the thermal expansion (thermal expansion pressure) of an encapsulating resin is also a factor causing the short-circuit failure and calculated the thermal expansion pressure of the encapsulating resin, the melt expansion pressure of the solder, and the respective thermal expansion pressures of the chip component and the substrate by simulation. Since the result of the calculation was consistent with the result of an actual experiment, the present inventors devised the present invention.

Referring to the drawings, the embodiments of the present invention will be described herein below in detail. In the following description, the components having substantially the same functions will be designated by the same reference numerals for clarity of illustration.

Embodiment 1

The first embodiment pertains to a module with embedded electronic components in which a semiconductor chip and a plurality of chip components are mounted on a substrate and encapsulated in a resin. The chip components are defined herein as electronic components such as a resistor, a capacitor, and a coil, which are those small in size and having electrodes provided on the outer surfaces thereof for surface mounting.

FIG. 1 is a schematic plan view of the module with embedded electronic components according to the present embodiment. A semiconductor chip 25 formed with an integrated circuit is mounted on the center portion of a substrate 10. A plurality of chip components 20 are mounted around the semiconductor chip 25. These are encapsulated in an encapsulating resin 30.

The substrate 10 is an organic substrate. As the substrate 10, a BT substrate is used herein. The semiconductor chip 25 is mounted on the substrate 10 and electrically connected to the chip components 20 and to external connection terminals, though they are not shown. The connection is provided by wirings formed on the surface of the substrate 10 and in the inside thereof, bonding wires, and the like.

Each of the chip components 20 is any of the resistor, capacitor, and coil. At least one of the three types of chip components is mounted on the substrate 10. There are some modules in which all of the three types are mounted, while there are others in which only the resistor and the capacitor are mounted.

Figure 2:
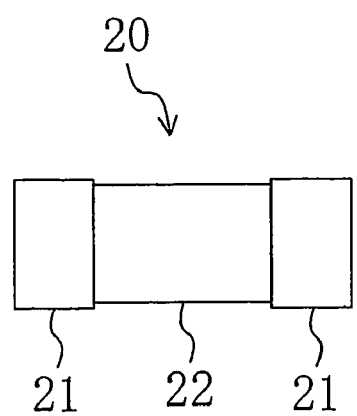
FIG. 2 is a front view of a chip component.

Each of the chip components 20 is composed of two electrode portions 21 and a main body portion 22 interposed therebetween, as shown in FIG. 2. The chip component 20 has a generally rectangular parallelepiped configuration in which each of the electrode portions 21 is slightly higher and deeper than the main body portion 22. The outer surface of the main body portion 22 is typically made of a ceramic and the top surface of each of the electrode portions 21 has Sn, Au, or the like provided on Ni.

A description will be given next to the prevention of a short circuit failure by focusing attention on one of the chip components 20 and the vicinity thereof.

Figure 3:
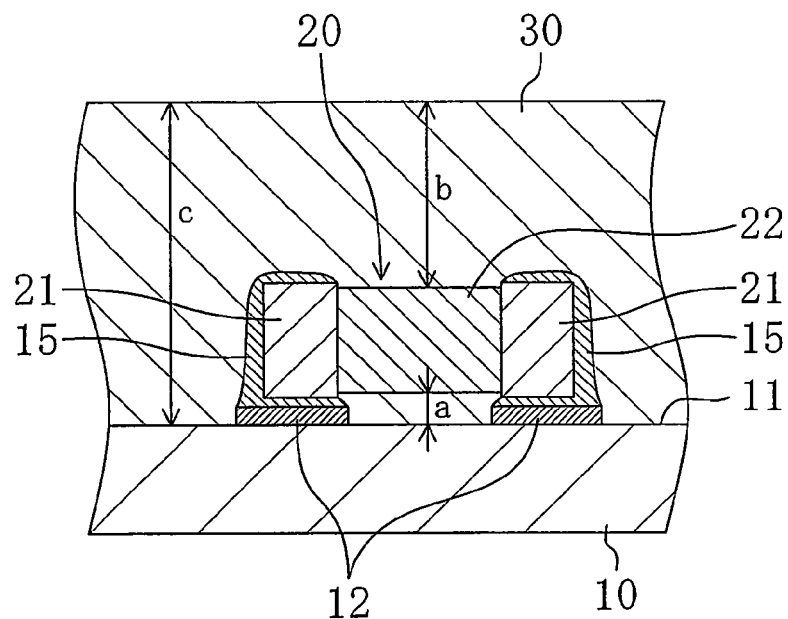
FIG. 3 is a cross-sectional view taken along the line III-III of FIG. 1.

FIG. 3 is a cross-sectional view taken along the line III-III of FIG. 1, which shows a cross section of a portion with one of the chip components 20 mounted thereon. Lands (connection electrodes) 12 are formed on the component mounting surface 11 of the substrate 10 on which the chip component 20 is mounted. The lands 12 are connected to the individual electrode portions 21 of the chip component 20. The electrode portions 21 are fixed to the individual lands 12 each by using a solder 15. In the present embodiment, a Sn—Ag—Cu solder alloy not containing lead is used.

In the fabrication of the module with embedded electronic components according to the present embodiment, the solder is disposed on each of the lands 12 of the substrate 10 by printing a solder paste thereon and the electrode portions 21 of the chip component 20 are placed thereon. Then, the solder is caused to reflow by heating and provide connection between the lands 12 and the electrode portions 21. Consequently, the solders 15 are interposed between the lands 12 and the electrode portions 21 and wet up the sidewalls of the electrode portions 21 even to the upper surfaces thereof so that a so-called solder fillet is formed. Since the outer surface of the main body portion 22 of the chip component 20 is made of the ceramic which shows low wettability to the solder, the solders 15 are prevented from lying on the outer surface of the main body portion 22 during the reflow step. After the solders 15 are caused to reflow, resin encapsulation using the encapsulating resin 30 is performed. In the present embodiment, an epoxy-based resin is used as the encapsulating resin 30.

At this time, a gap is formed between the component mounting surface 11 and the lower surface of the main body portion 22. The distance a between the component mounting surface 11 and the lower surface of the main body portion 22 corresponds to the sum of the thickness of each of the lands 12, the thickness of each of the interposed solders 15, and the outwardly protruding dimension of each of the electrode portions 21 from the main body portion 22. The encapsulating resin also enters the gap.

Thus, the module with embedded electronic components is completed by resin encapsulation. The external connection terminals (not shown) for contact with an external substrate such as a printed wiring substrate have been formed on the surface of the substrate 10 opposite to the component mounting surface 11. The external connection terminals are connected and fixed to the external substrate by using a solder. During the connection and fixation also, a solder reflow step is performed. During the solder reflow step (that is, the step of reflow-mounting), the problem that a short circuit occurs in the module with embedded electronic components has been encountered, as described above.

As already stated, Japanese Laid-Open Patent Publication No. 2002-208668 has attributed the cause of the short circuit failure occurring in the step of reflow-mounting the module to the printed wiring substrate to the melt expansion pressure when the solder remelts. During the reflow-mounting step, however, the heat involved therein also causes the thermal expansion of the encapsulating resin. In view of this, the present inventors considered that, if an examination was made by giving consideration also to the thermal expansion pressure of the encapsulating resin in addition to the melt expansion pressure of the solder, the short circuit failure could be prevented without changing the type of the encapsulating resin.

Figure 4:
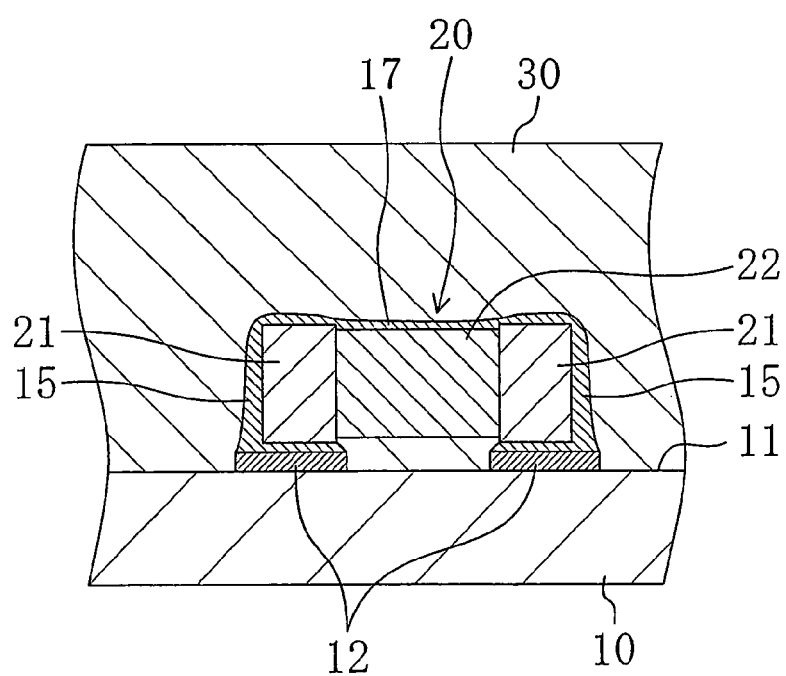
FIG. 4 is a cross-sectional view showing the state of a solder bridge.

As shown in FIG. 4, the short circuit failure is a phenomenon in which the solders 15 lying on the upper surfaces of the electrode portions 21 flow over the upper surface of the main body portion 22 to provide a linkage between the two electrode portions 22 (a solder bridge).

The encapsulating resin 30 is located above the chip component 20 and also simultaneously located between the chip component 20 and the substrate 10. The present inventors focused attention on this point and examined the thermal expansion of each of the encapsulating resin 30, the chip component 20, and the substrate 10 and also the volume expansion of the melted solders 15 by simulation. As a result, it was found that the expansion thereof caused a stress in each of the encapsulating resin 30 and the solders 15 and the stress is concentrated on the portion of the interface between the encapsulating resin 30 and each of the solders 15 which is located in the vicinity of the boundary between each of the electrode portions 21 and main body portion 22 of the chip component 20. The present inventors also presumed that the solder bridge is formed when the stress exceeds the bonding strength between the encapsulating resin 30 and the main body portion 22 and further performed an examination by simulation such that the stress became smaller than the bonding strength.

The thickness of the portion of the encapsulating resin 30 which is located above the main body portion 22 of the chip component 20 is designated as b and b/a is designated as one parameter. On the other hand, a peak temperature when the module is reflow-mounted on a printed wiring substrate or the like is designated as another parameter. Hereinafter, a reflow-mounting step will indicate the step of reflow-mounting the module to a printed wiring substrate or the like. The melting point of a solder used for the mounting of the module to a printed wiring substrate or the like is about 220° C. In the current situation, the peak temperature in the reflow-mounting step has been set to 260 to 270° C. to ensure reliable and short-time mounting.

Figures 5, 6:
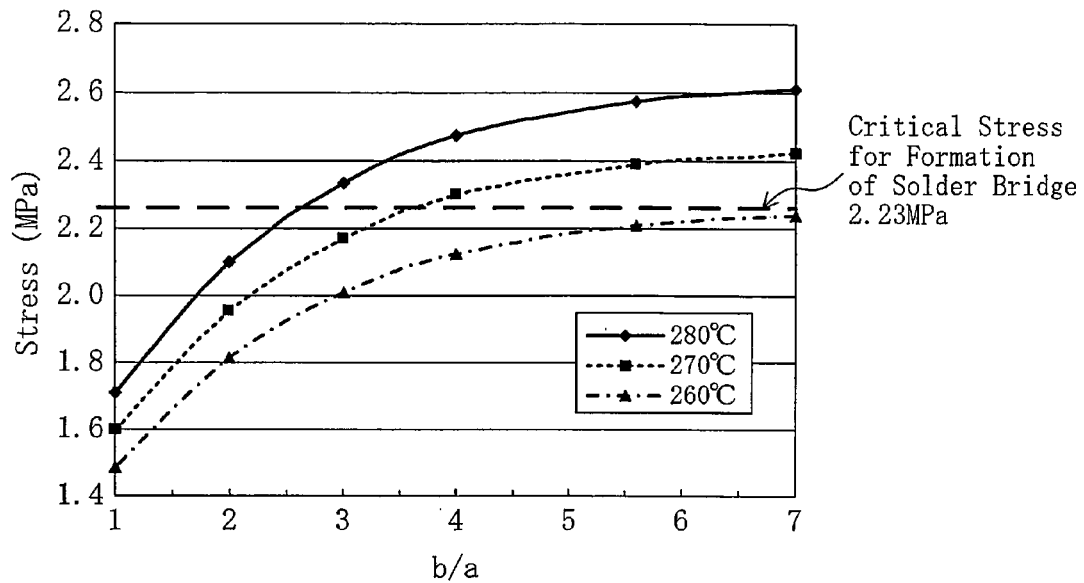
FIG. 5 is a view showing the result of a simulation using an organic substrate.
FIG. 6 is a view showing the frequency of the occurrence of the short-circuit failure in an actual reflow-mounting step.

FIG. 5 shows the result of a simulation. In the simulation, 260° C., 270° C., and 280° C. were set as three conditional peak temperatures for the reflow-mounting step and the relation between the stress and the b/a were graphed. The stress mentioned above is generated at the interface between the encapsulating resin 30 and each of the solders 15 in the vicinity of the boundary between each of the electrode portions 21 and main body portion 22 of the chip component 20. As shown in FIG. 5, the stress represented by the ordinate axis decreases as the b/a represented by the abscissa axis decreases, while the stress increases as the peak temperature increases.

The bonding strength between the chip component 20 and the encapsulating resin 30 was determined by a simulation. Specifically, the chip component 20 was placed on the encapsulating resin 30 and the adhesion strength between the encapsulating resin and the chip component was measured. As a result of determining the bonding strength between the chip component 20 and the encapsulating resin 30 based on the result of the measurement, it was 2.23 MPa. The result of the simulation shows that, when the stress exceeds 2.23 MPa in FIG. 5, the probability of the formation of the solder bridge is high. In the following description, a stress of 2.23 MPa will be referred to as "critical stress for the formation of a solder bridge". When the b/a is 7 at the peak temperature of 260° C., the stress shown in FIG. 5 is 2.238 MPa so that it is substantially coincident with the critical stress for the formation of a solder bridge. Since the stress shown in FIG. 5 is smaller as the b/a is smaller, the probability of the formation of the solder bridge lowers as the b/a is smaller than 7. Likewise, it is also shown in FIG. 5 that the probability of the formation of the solder bridge lowers when the b/a is not more than about 3.6 at the peak temperature of 270° C. and when the b/a is not more than about 2.6 at the peak temperature of 280° C.

FIG. 6 shows the result of performing an actual reflow-mounting step at 270° C., which involved the occurrence of the short circuit failure. In the drawing, "First-Time Reflow Step" and "Second-Time Reflow Step" indicate the respective results of performing the reflow-mounting step once and twice. As an exemplary case where the reflow-mounting step is performed twice, there can be listed the case where individual modules with embedded electronic components are mounted on both sides of a printed wiring substrate. In this case, one of the modules with embedded electronic components is first mounted on one side (first-time reflow step) of the substrate and then the other module with embedded electronic components is mounted on the other side thereof (second-time reflow step). The numeric values of 0/30 and 2/10 also shown in FIG. 6 indicate that, when the total numbers of samples were 30 and 10, the respective numbers of the samples with short circuits were 0 and 2. It is to be noted that the BT substrate has a moisture absorbing property and, when it has absorbed moisture, the absorbed moisture component evaporates during the reflow-mounting step to degrade the interfacial bonding force between the encapsulating resin 30 and another structure. In the step of processing a typical module with embedded electronic components, however, the processing thereof in the state with no moisture absorption requires more labor and more cost. Accordingly, the module with embedded electronic components is mostly processed in the state with moisture absorption for the saving of labor and cost. For this reason, the reflow-mounting step was performed by preliminarily placing the module with embedded electronic components in the state with moisture absorption. Conditions for moisture absorption were such that the module with embedded electronic components was preserved in an environment at a 65% relative humidity for 12 hours and that the module with embedded electronic components was also preserved in the foregoing environment for 12 more hours before each of the first-time reflow step and the second-time reflow step was performed.

In FIG. 6, c is a value obtained by measuring the resin thickness c (see FIG. 3) in an actual sample, while the b/a was measured from the representative value of the a measured at the cross section of the sample and from the value of the b determined by subtracting the sum of the a and the standard value of the thickness of the chip component 20 from the value of the c mentioned above.

As shown in FIG. 6, the short circuit failure due to the solder bridge occurred when the b/a was not less than 4.2 and the frequency of the formation of the solder bridge was higher as the b/a is larger. The result is consistent with the result of the simulation shown in FIG. 5 in which the b/a at the point where the curve representing the stress at the peak temperature of 270° C. reached 2.23 MPa as the critical stress for the formation of a solder bridge was about 3.6 and the stress was larger as the b/a is larger.

Figures 7, 8:
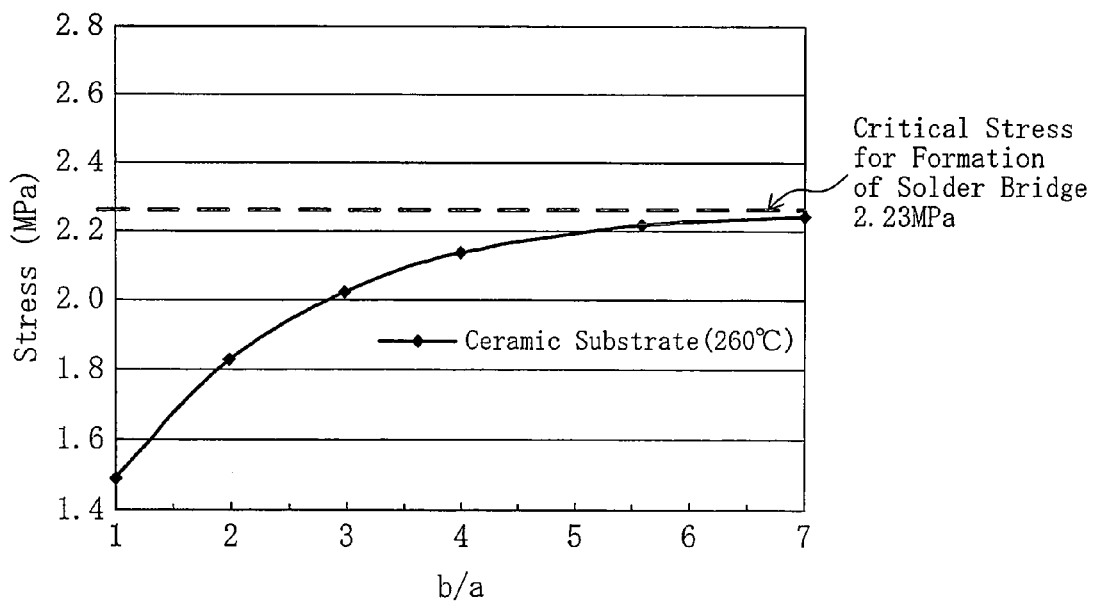
FIG. 7 is a view showing the frequency of the occurrence of the short-circuit failure in an actual reflow-mounting step.
FIG. 8 is a view showing the result of a simulation using a ceramic substrate.

FIG. 7 shows the result of further performing a reflow experiment, in which the c was set to the two conditional ranges of not less than 450 μm and not more than 500 μm and not less than 610 μm and not more than 670 μm, while the b/a corresponding thereto was not less than 2.0 and not more than 3.0 and not less than 5.2 and not more than 6.5. Conditions for moisture absorption in the result of the reflow experiment were such that the module with embedded electronic components was preserved in an environment at a 30° C. temperature and at a 70% relative humidity for 216 hours and evaluation was performed at the three conditional reflow peak temperatures of 260° C., 270° C., and 280° C. As shown in FIG. 7, the short circuit failures occurred when the b/a was not less than 5.2 and not more than 6.5 but no short circuit failure occurred when the b/a was not less than 2.0 and not more than 3.0 even at the reflow peak temperature of 280° C. In addition, the frequency of the occurrence of the short circuit failure was higher as the reflow peak temperature was higher. The result of the experiment shown in FIG. 7 is consistent with the result of the simulation shown in FIG. 5 in which a larger stress was generated as the reflow peak temperature was higher and the b/a at the point where the curve representing the stress at the peak temperature of 280° C. reached 2.23 MPa as the critical stress for the formation of a solder bridge was about 2.6.

Since the result of performing the actual reflow-mounting step is thus consistent with the result of the simulation, it can be considered that the hypothesis made for the simulation is rational and that the actual b/a and c or the reflow temperature in the reflow-mounting step may be determined appropriately by simulation.

From the foregoing results of the simulation and the experiment, the b/a value for preventing the short circuit failure can be determined properly as follows.

That is, the b/a is preferably not more than 6 under the current reflow conditions for the reflow-mounting step (including the peak temperature of 260° C.). This is because, as shown in FIG. 5, when the reflow peak temperature is 260° C., the stress value when the b/a was not more than 6 was under 2.23 MPa as the value of the critical stress for the formation of a solder bridge.

However, since the temperature of 260° C. is closer to the lower-limit temperature for performing the reflow-mounting step, the step is preferably performed at temperature of not less than 265° C. to ensure reliable mounting and, more preferably, the b/a is not more than 5. According to the result of the experiment shown in FIG. 6, the short circuit failure does not occur when the b/a is not more than 5 provided that reflow-mounting step is performed only once at 270° C. More preferably, the b/a is not more than 4. When the reflow-mounting step is performed twice at 270° C., the short circuit failure does not occur when the b/a is not more than 4. More preferably, the b/a is not more than 3. According to the result of the experiment shown in FIG. 7, even when the reflow temperature for the reflow mounting step is increased to 280° C., the short circuit failure does not occur provided that the b/a is not more than 3. To prevent the upper surface of the chip component 20 from being exposed at the surface of the encapsulating resin 30, the b/a is preferably larger than 1.

Although the ratio b/a is used for the foregoing conditions, the distance a between the lower surface of the main body portion 22 of the chip component 20 and the component mounting surface 11 of the substrate 10 is preferably not less than 30 μm and not more than 60 μm in terms of the design of the substrate and the filling property of the encapsulating resin 30. Since the thickness of each of the lands 12 is mostly about 40 μm and the thickness of each of the solders 15 interposed between the electrode portions 21 and the lands 12 is about not less than 10 μm and not more than 20 μm, the distance a between the lower surface of the main body portion 22 of the chip component 20 and the component mounting surface 11 of the substrate 10 is more preferably not less than 50 μm and not more than 60 μm.

The total thickness of the encapsulating resin 30 located above the substrate 10 shown in FIG. 3, i.e., the thickness c of the encapsulating resin located above the component mounting surface 11 is preferably not less than 400 μm and not more than 600 μm. As shown in FIGS. 6 and 7, when the thickness c of the encapsulating resin located above the component mounting surface 11 is not more than 600 μm, it is possible to prevent the occurrence of the short circuit failure in the first-time reflow step. When the thickness c of the encapsulating resin located above the component mounting surface 11 is not less than 400 μm, it is possible to prevent the upper surface of the chip component 20 from being exposed at the surface of the encapsulating resin 30. Preferably, the thickness of the substrate 10 is not less than 500 μm and not more than 700 μm. When the thickness of the substrate 10 is extremely small compared with the thickness c of the encapsulating resin located above the component mounting surface 11, the substrate 10 cannot endure the weight of the encapsulating resin and, consequently, there are cases where the substrate 10 cannot hold the module with embedded electronic components flat. Therefore, to hold the module with embedded electronic components flat, the thickness of the substrate 10 is preferably adjusted to be equal to the thickness c of the encapsulating resin located above the component mounting surface 11.

Since the thickness of the chip component 20 is mostly about 300±30 μm, when the thickness c of the encapsulating resin located above the component mounting surface 11 is not less than 400 μm and not more than 600 μm and when the distance a between the lower surface of the main body portion 22 of the chip component 20 and the component mounting surface 11 is not less than 30 μm and not more than 60 μm, the thickness b of the portion of the encapsulating resin which is located above the main body portion 22 becomes not less than 100 μm and not more than 200 μm.

As has been described thus far, since the present embodiment has adjusted the b/a to a value of not more than 6, it becomes possible to prevent the occurrence of the short circuit failure during the reflow-mounting step without using a special encapsulating resin. By thus setting the value of the b/a, mounting free from the short circuit failure can be performed by using the reflow conditions for the reflow-mounting step that have been used conventionally without any modification.

In other words, in the present embodiment, the distance a between the lower surface of the main body portion 22 of the chip component 20 and the component mounting surface 11 of the substrate 10 is not less than 30 μm and not more than 60 μm, more preferably not less than 50 μm and not more than 60 μm, while the thickness c of the encapsulating resin located above the component mounting surface 11 is not less than 400 μm and not more than 600 μm. When the thickness of the chip component 20 is assumed to be about 300±30 μm, the thickness b of the encapsulating resin located above the main body portion 22 becomes not less than 100 μm and not more than 200 μm and hence the b/a can be adjusted to a value of not more than 6.

The encapsulating resin 30 is not limited to a low-elasticity resin such as a silicone resin or an epoxy resin disclosed in Japanese Laid-Open Patent Publication No. 2002-208668. Various resins can be used for the encapsulating resin 30. Therefore, if encapsulation is performed by using a low-viscosity resin, the degradation of moldability for encapsulation can be prevented. If encapsulation is performed by using a high-elasticity resin, the appearance of the module with embedded electronic components when it is fabricated by using the following fabrication method is improved. In accordance with the fabrication method, a base-material substrate formed with a plurality of regions having wirings each formed in a specified configuration is used as a substrate. After the chip component 20 and the semiconductor chip 25 are mounted on each of the regions of the base-material substrate, the base-material substrate is divided into the individual regions such that the plurality of modules with embedded electronic components are fabricated from the single base-material substrate.

Before performing the simulation described above, the present inventors considered that, to prevent the short circuit failure, it is sufficient to set the thermal expansion pressure of the encapsulating resin such that it is larger than the melt expansion pressure of the solder and, for this purpose, the thickness of the portion of the encapsulating resin which is located above the chip component 20 might be increased appropriately. However, the result described above is entirely contrary to the consideration. The present inventors focused attention on the fact that the encapsulating resin 30 was located above the chip component 20 and also simultaneously located between the chip component 20 and the substrate 10 and examined the thermal expansion of the encapsulating resin 30 and the volume expansion of the melted solder 15 by simulation. As a result, the present inventors found that the ratio between the distance a between the component mounting surface 11 and the lower surface of the main body portion 22 and the thickness b of the portion of the encapsulating resin 30 which is located above the main body portion 22 was largely related to the occurrence of the short circuit failure.

However, the finding was made for the first time by the present inventors and is not disclosed in Japanese Laid-Open Patent Publication No. 2002-208668.

Embodiment 2

A module with embedded electronic components according to the second embodiment of the present invention is different from the module with embedded electronic components according to the first embodiment only in the substrate so that a description will be given to the different portion.

The substrate according to the present invention is a ceramic substrate. Compared with the organic substrate, the ceramic substrate has an extremely poor moisture absorbing property so that the thermal expansion of the encapsulating resin during the reflow-mounting step is smaller than in the first embodiment. However, the result of the simulation was the same as in the first embodiment. FIG. 8 shows the result of the simulation when the module with embedded electronic components in which the ceramic substrate is used as the substrate is reflow-mounted. In the simulation, the reflow peak temperature was set to 260° C. As shown in FIG. 8, the result of the simulation presents a curve substantially the same as that presented by the result of the simulation using the organic substrate shown in FIG. 5. The stress generated when the b/a was 7 was 2.224 MPa which was lower than 2.23 MPa (critical stress for the formation of a solder bridge). Accordingly, the module with embedded electronic components designed with the same b/a value as used in the first embodiment achieved the same effect of preventing the short circuit failure as achieved by the first embodiment.

Since the moisture absorbing property of the ceramic substrate is inferior to that of the organic substrate as described above, the use of the ceramic substrate exerts the effect of suppressing interface delamination induced by moisture absorption during the reflow mounting step compared with the case where the organic substrate is used.

Other Embodiments

The embodiments described above are only illustrative and the present invention is not limited thereto. The number of the semiconductor chips 25 is not limited to one and the position at which each of the semiconductor chips 25 is disposed on the substrate 10 is not limited, either. For example, the number of the semiconductor chips 25 may be not less than 2 and they may be disposed at positions other than the center of the substrate 10. The semiconductor chip or chips 25 may also be mounted on the surface of the substrate 10 opposite to the component mounting surface 11. The semiconductor chip or chips 25 may be buried in the substrate 10. The number of the chip components 20 is also not particularly limited provided that it is plural.

Preferably, the b/a value is the same for each of the chip components 20 in one module with embedded electronic components. However, the b/a value need not be the same for all the chip components 20 since a sufficient effect is achievable provided that 80% or more of the chip components 20 have the same b/a value.

The organic substrate is not limited to the BT substrate. The organic substrate may be an FR4 substrate or may be an organic substrate other than that.

The encapsulating resin 30 may be a resin other than the epoxy-based resin. The encapsulating resin 30 may be, e.g., a silicon-based resin or the like. It is also possible to add a filler to the encapsulating resin 30.

Preferably, each of the solders 15 connecting and fixing the connection electrodes 12 and the electrode portions 21 does not contain lead. However, the solder 15 is not limited to the Sn—Ag—Cu solder alloy. The solder 15 may be a Sn—Sb solder alloy, a Sn—Bi solder, or the like.

What is claimed is:

1. A module with embedded electronic components comprising:
    a substrate;
    an electronic component which is mounted on the substrate; and
    an encapsulating resin in which the electronic components are encapsulated, wherein
    connection electrodes connected to the electronic components are formed on a component mounting surface of the substrate on which the electrode component is mounted,
    the electronic component comprises two electrode portions fixed to the individual connection electrodes each by using a solder and a main body portion interposed between the two electrode portions, and
    wherein a thickness of the portion of the encapsulating resin which is located above the main body portion is not less than 100 μm and not more than 200 μm, and
    a thickness of the portion of the encapsulating resin which is located above the component mounting surface is not less than 400 μm and not more than 600 μm.

2. The module with embedded electronic components of claim 1, wherein a thickness of the substrate is not less than 500 μm and not more than 700 μm.

3. A module with embedded electronic components comprising:
    a substrate;
    an electronic component which is mounted on the substrate; and
    an encapsulating resin in which the electronic components are encapsulated, wherein
    connection electrodes connected to the electronic components are formed on a component mounting surface of the substrate on which the electrode component is mounted,
    the electronic component comprises two electrode portions fixed to the individual connection electrodes each by using a solder and a main body portion interposed between the two electrode portions, and
    a thickness of the portion of the encapsulating resin which is located above the component mounting surface is not less than 400 μm and not more than 600 μm, and
    a distance between the component mounting surface and a lower surface of the main body portion is not less than 30 μm and not more than 60 μm.

4. The module with embedded electronic components of claim 3, wherein a thickness of the substrate is not less than 500 μm and not more than 700 μm.

* * * * *